(12) United States Patent
Yin et al.

(10) Patent No.: US 11,164,896 B2
(45) Date of Patent: Nov. 2, 2021

(54) ARRAY SUBSTRATE AND DISPLAY PANEL

(71) Applicant: WUHAN CHINA STAR OPTOELECTRONICS TECHNOLOGY CO., LTD., Hubei (CN)

(72) Inventors: Weihong Yin, Hubei (CN); Xindong Mei, Hubei (CN)

(73) Assignee: WUHAN CHINA STAR OPTOELECTRONICS TECHNOLOGY CO., LTD, Hubei (CN)

( * ) Notice: Subject to any disclaimer, the term of this patent is extended or adjusted under 35 U.S.C. 154(b) by 571 days.

(21) Appl. No.: 16/090,596

(22) PCT Filed: Aug. 23, 2018

(86) PCT No.: PCT/CN2018/101919
§ 371 (c)(1),
(2) Date: Oct. 2, 2018

(87) PCT Pub. No.: WO2019/205367
PCT Pub. Date: Oct. 31, 2019

(65) Prior Publication Data
US 2021/0225875 A1 Jul. 22, 2021

(30) Foreign Application Priority Data
Apr. 28, 2018 (CN) .......................... 201810400508.9

(51) Int. Cl.
*G06F 3/041* (2006.01)
*H01L 27/12* (2006.01)
(Continued)

(52) U.S. Cl.
CPC ........ *H01L 27/124* (2013.01); *G02F 1/13338* (2013.01); *G02F 1/136209* (2013.01); *G06F 3/0412* (2013.01); *G02F 1/13685* (2021.01)

(58) Field of Classification Search
CPC ............... H01L 27/124; G02F 1/13338; G02F 1/136209; G02F 1/13685; G06F 3/0412
See application file for complete search history.

(56) References Cited

U.S. PATENT DOCUMENTS 10,095,339 B1 * 10/2018 Tsai ........................ B32B 15/04
2008/0211975 A1 * 9/2008 Sera .................... G02F 1/13394
349/12

(Continued)

FOREIGN PATENT DOCUMENTS

CN  102707522 A  10/2012
CN  104503172 A  4/2015
(Continued)

*Primary Examiner* — Joe H Cheng
(74) *Attorney, Agent, or Firm* — Soroker Agmon Nordman

(57) ABSTRACT

An array substrate and a display panel are disclosed, the array substrate includes a substrate, a light shielding layer, an insulation layer, and a metal layer. The array substrate has a first region being transparent and a second region being opaque. The metal layer includes a data line and a first touch wiring. The light shielding layer includes a second touch wiring coupled with the first touch wiring. At least one portion of the second touch wiring is disposed below a portion of the data line close to the first region.

10 Claims, 2 Drawing Sheets

(51) Int. Cl.
    *G02F 1/1333*     (2006.01)
    *G02F 1/1362*     (2006.01)
    *G02F 1/1368*     (2006.01)

(56) References Cited

U.S. PATENT DOCUMENTS

| | | |
|---|---|---|
| 2012/0249436 A1 | 10/2012 | Choi et al. |
| 2015/0243681 A1* | 8/2015 | Sung .................... H01L 27/124 |
| | | 257/72 |
| 2015/0378486 A1* | 12/2015 | Yu ........................ G06F 3/0446 |
| | | 345/174 |
| 2016/0246427 A1 | 8/2016 | Ming et al. |
| 2017/0059912 A1 | 3/2017 | Kim et al. |
| 2017/0153766 A1* | 6/2017 | Kimura ................. G02F 1/1368 |
| 2017/0213873 A1* | 7/2017 | Bok ....................... G06F 3/0443 |
| 2017/0222059 A1 | 8/2017 | Chen et al. |
| 2018/0067592 A1* | 3/2018 | Kimura ................. G06F 3/0445 |
| 2018/0196565 A1 | 7/2018 | Qu |
| 2018/0203313 A1* | 7/2018 | Wang ................ G02F 1/136286 |
| 2018/0260058 A1* | 9/2018 | Zhan ..................... G06F 3/047 |
| 2018/0292934 A1* | 10/2018 | Xu ....................... G06F 3/0412 |
| 2018/0356664 A1* | 12/2018 | Yang ................ H01L 29/66757 |
| 2019/0129545 A1* | 5/2019 | Chen ..................... G06F 3/0443 |
| 2019/0155430 A1 | 5/2019 | Hwang ................. G06F 3/0416 |
| 2020/0185416 A1* | 6/2020 | Wu ..................... H01L 29/6675 |

FOREIGN PATENT DOCUMENTS

| | | | |
|---|---|---|---|
| CN | 104900658 A | | 9/2015 |
| CN | 105487718 A | | 4/2016 |
| CN | 108648250 A | | 5/2017 |
| KR | 20170076184 A | * | 7/2017 |

* cited by examiner

ARRAY SUBSTRATE AND DISPLAY PANEL

CROSS REFERENCE TO RELATED APPLICATION

This application is a national stage of PCT/CN2018/101919, filed on Aug. 23, 2018 and claims priority to Chinese Application No. 201810400508.9, filed on Apr. 28, 2018, the content of which in its entirety is herein incorporated by reference.

FIELD OF INVENTION

The present disclosure relates to the technical field of displays, and specifically to an array substrate and a display panel.

BACKGROUND OF INVENTION

In design of a liquid crystal display (LCD), an aperture ratio of an array substrate is an important technical indicator for determining display of the LCD. If the aperture ratio increases, then efficiency of light passing through increases. The aperture ratio refers to a proportion of an area of a light passing part of a total area.

However, after the light is emitted through a backlight plate, many structures block the light from exiting. For example, in an In-cell display, a touch wiring and data lines are formed in the same layer by a single photomask process, in order to reduce a number of manufacturing processes. However, in the above method, the touch wiring occupies a large part of an aperture region, thereby it causes that the aperture ratio of the array substrate is too low.

SUMMARY OF INVENTION

An objective of embodiments of the present disclosure is to provide an array substrate and a display panel, which improves an aperture ratio of the array substrate.

An array substrate is provided in an embodiment of the present disclosure, and includes a substrate, a light shielding layer disposed on the substrate, an insulation layer disposed on the light shielding layer, and a metal layer disposed on the insulation layer, wherein the array substrate has a first region being transparent and a second region being opaque, and the light shielding layer, the insulation layer, and the metal layer are disposed on the second region;
wherein the metal layer includes a data line and a first touch wiring;
wherein the light shielding layer includes a second touch wiring coupled with the first touch wiring, at least one portion of the second touch wiring is disposed below a portion of the data line close to the first region;
wherein a width of the first touch wiring is less than or equal to a width of the data line; and
wherein the insulation layer is provided with a plurality of through holes, and the second touch wiring is coupled with the first touch wiring through the through holes.

In some embodiments, the light shielding layer includes a plurality of second touch wirings arranged in an array, the through holes comprise a first through hole and a second through hole, and two ends of the first touch wiring couple with two of the second touch wirings arranged in a same column and adjacent to each other through the first through hole and the second through hole.

In some embodiments, the light shielding layer further includes a light shielding portion, the light shielding portion and the second touch wiring are formed by a single photomask process.

In some embodiments, constituent materials of the second touch wiring include one or more of molybdenum, aluminum, aluminum-nickel alloy, molybdenum-tungsten alloy, chromium, or copper.

In some embodiments, one portion of the first touch wiring is close to the first region and rest portion of the first touch wiring are away from the first region, alternatively, the first touch wiring is fully away from the first region.

Another array substrate is provided in an embodiment of the present disclosure, and includes a substrate, a light shielding layer disposed on the substrate, an insulation layer disposed on the light shielding layer, and a metal layer disposed on the insulation layer, wherein the array substrate has a first region being transparent and a second region being opaque, and the light shielding layer, the insulation layer, and the metal layer are disposed on the second region;
wherein the metal layer comprises a data line and a first touch wiring; and
wherein the light shielding layer comprises a second touch wiring coupled with the first touch wiring, at least one portion of the second touch wiring is disposed below a portion of the data line close to the first region.

In some embodiments, a width of the first touch wiring is less than or equal to a width of the data line.

In some embodiments, the insulation layer is provided with a plurality of through holes, and the second touch wiring is coupled with the first touch wiring through the through holes.

In some embodiments, the light shielding layer includes a plurality of second touch wirings arranged in an array, the through holes includes a first through hole and a second through hole, and two ends of the first touch wiring couple with two of the second touch wirings arranged in a same column and adjacent to each other through the first through hole and the second through hole.

In some embodiments, the light shielding layer further includes a light shielding portion, the light shielding portion and the second touch wiring are formed by a single photomask process.

In some embodiments, constituent materials of the second touch wiring include one or more of molybdenum, aluminum, aluminum-nickel alloy, molybdenum-tungsten alloy, chromium, or copper.

In some embodiments, one portion of the first touch wiring is close to the first region and rest portion of the first touch wiring are away from the first region, alternatively, the first touch wiring is fully away from the first region.

A display panel is provided in an embodiment of the present disclosure, the display panel includes an array substrate, the array substrate includes a substrate, a light shielding layer disposed on the substrate, an insulation layer disposed on the light shielding layer, and a metal layer disposed on the insulation layer, wherein the array substrate has a first region being transparent and a second region being opaque, and the light shielding layer, the insulation layer, and the metal layer are disposed on the second region;
wherein the metal layer comprises a data line and a first touch wiring; and
wherein the light shielding layer comprises a second touch wiring coupled with the first touch wiring, at least one portion of the second touch wiring is disposed below a portion of the data line close to the first region.

In some embodiments, a width of the first touch wiring is less than or equal to a width of the data line.

In some embodiments, the insulation layer is provided with a plurality of through holes, and the second touch wiring is coupled with the first touch wiring through the through holes.

In some embodiments, the light shielding layer includes a plurality of second touch wirings arranged in an array, the through holes includes a first through hole and a second through hole, and two ends of the first touch wiring couple with two of the second touch wirings arranged in a same column and adjacent to each other through the first through hole and the second through hole.

In some embodiments, the light shielding layer further comprises a light shielding portion, the light shielding portion and the second touch wiring are formed by a single photomask process.

In some embodiments, constituent materials of the second touch wiring include one or more of molybdenum, aluminum, aluminum-nickel alloy, molybdenum-tungsten alloy, chromium, or copper.

In some embodiments, one portion of the first touch wiring is close to the first region and rest portion of the first touch wiring are away from the first region, alternatively, the first touch wiring is fully away from the first region.

In the array substrate and the display panel of the embodiments of the present disclosure, the aperture ratio of the array substrate may be improved by forming the second touch wiring on the light shielding layer and disposing at least one portion of the second touch wiring below the portion of the data line close to the first region.

In order to make the above content of the present disclosure more obvious and easy to understand, a detailed description of the preferred embodiments are described below in conjunction with the accompanying drawings as follows.

DETAILED DESCRIPTION OF PREFERRED EMBODIMENTS

Figure 1:
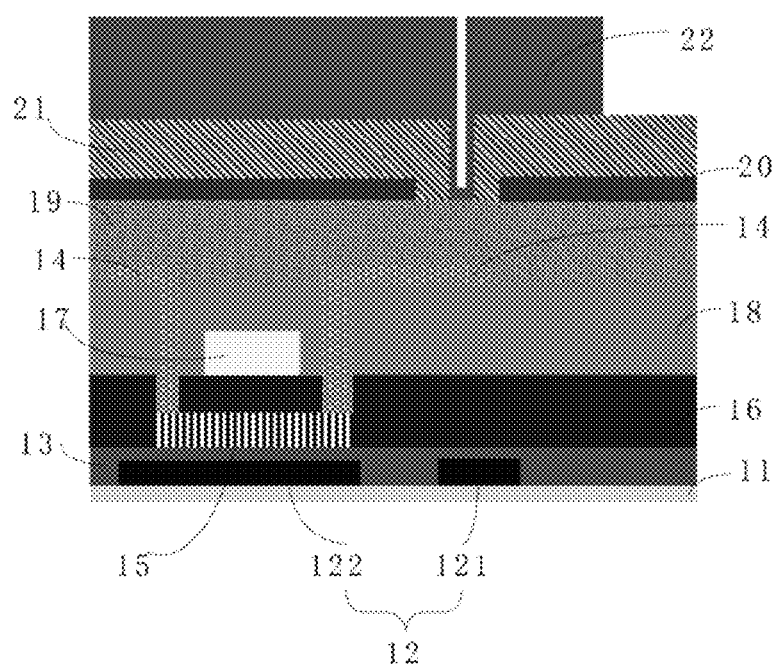
FIG. 1 is a structural schematic of an array substrate provided in an embodiment of the present disclosure.

The following description of each embodiment refers to the appended drawings for illustrating specific embodiments in which the present disclosure may be practiced. Directional terms as mentioned in the present disclosure, such as "up". "down" "front", "rear", "left", "right", "inside", "outside". "lateral", etc., are merely used for the purpose of illustrating and understanding the present disclosure and are not intended to be limiting of the present disclosure.

In the drawings, units with similar structures are denoted by the same reference numerals.

Referring herein to "an embodiment" means that a particular feature, structure, or characteristic described in connection with the embodiment may be included in at least one embodiment of the disclosure. The appearances of the phrase in various places in the specification are not necessarily all referring to the same embodiment, nor are separate or alternative embodiments mutually exclusive of other embodiments. The explicit and implicit understanding to a person having ordinary skill in the art is that the embodiments described herein may be combined with other embodiments.

Figure 2:
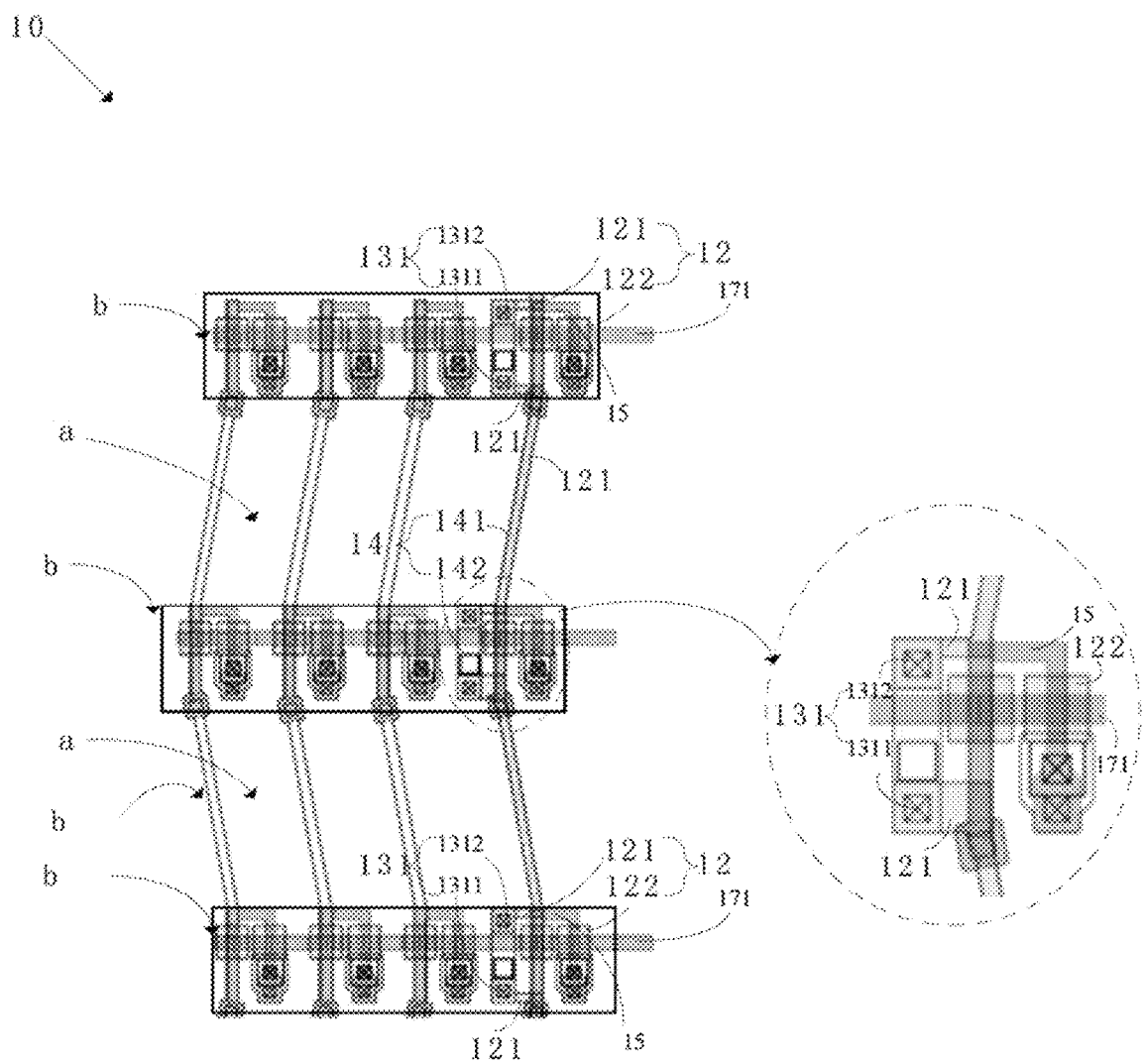
FIG. 2 is another structural schematic of the array substrate provided in the embodiment of the present disclosure.

An embodiment of the present disclosure provides a display panel, which may be a liquid crystal display panel. Specifically, the display panel includes an array substrate. Please refer to FIG. 1, which is a structural schematic of an array substrate provided in an embodiment of the present disclosure. As shown in FIG. 1, the array substrate 10 includes a substrate 11, a light shielding layer 12 disposed on the substrate 11, an insulation layer 13 disposed on the light shielding layer 12, and a metal layer 14 disposed on the insulation layer 13. It should be noted that, as shown in FIG. 2, the array substrate 10 has a first region a being transparent and a second region b being opaque. Specifically, the light shielding layer 12, the insulation layer 13, and the metal layer 14 are sequentially disposed on the second region b.

The substrate 11 may be made of a flexible material or a rigid material. Specifically, the substrate 11 may be a glass substrate.

As shown in FIG. 2, the metal layer 14 includes a data line 141 and a first touch wiring 142, wherein constituent materials of both the data line 141 and the first touch wiring 142 may include one or more of molybdenum, aluminum, aluminum-nickel alloy, molybdenum-tungsten alloy, chromium, or copper. It should be noted that, the data line 141 and the first touch wiring 142 may be made of the same materials, that is, the data line 141 and the first touch wiring 142 may be formed by a single photomask process.

Specifically, as shown in FIG. 2, one portion of the data line 141 may be close to the first region a and rest portion of the data line 141 may be away from the first region a. In some embodiments, similar to the data line 141, one portion of the first touch wiring 142 may be close to the first region a and rest portion of the first touch wiring 142 may be away from the first region a. Preferably, as shown in FIG. 2, the first touch wiring 142 may also be fully away from the first region a.

The light shielding layer 12 includes a second touch wiring 121 and a light shielding portion 122, wherein the light shielding portion 122 may be made of a light shielding material, such as a-Si, metal material, and the like. Specifically, the second touch wiring 121 and the light shielding portion 122 may be made of the same materials, such as one or more of molybdenum aluminum, aluminum-nickel alloy, molybdenum-tungsten alloy, chromium, or copper, that is, the second touch wiring 121 and the light shielding portion 122 may be formed by a single photomask process.

At least one portion of the second touch wiring 121 is disposed below a portion of the data line 141 close to the first region a. In this way, the second touch wiring 121 does not occupy an excess of the space of the first region a, thereby improving an aperture ratio of the array substrate 10. Preferably, a width of the second touch wiring 121 may be set to be less than or equal to a width of the data line 141, such that the second touch wiring 121 is completely shielded by the data line 141.

The insulation layer 13 is used to isolate the light shielding layer 12 and the metal layer 14. The insulation layer 13 includes a multi-layer structure, which is composed of SiNx (silicon nitride) and SiO2 (silicon dioxide). As shown in FIG. 2, the insulation layer 13 is provided with a plurality of through holes 131, and the second touch wiring 121 may be coupled with the first touch wiring 142 through the through, holes 131. Specifically, a partial enlarged view of the through holes 131 as shown in FIG. 2, the through holes 131 include a first through hole 1311 and a second through hole 1312. The first touch wiring 142 is coupled with the second touch wiring 121 over the first touch wiring 142 through the first through hole 1311, and is coupled with the second touch wiring 121 through the second through hole 1312. That is, the first touch wiring 142 is coupled with the second touch wiring 121 through the first through hole 1311 and the second through hole 1312.

Please refer to FIG. 1 and FIG. 2, the array substrate 10 further includes a doping layer 15, a first insulating layer 16, a gate wiring layer 17, a second insulating layer 18, a planar layer 19, a first electrode layer 20, a third insulating layer 21, and a second electrode layer 22. The doping layer 15, the first insulating layer 16, the gate wiring layer 17, and the second insulating layer 18 are sequentially disposed between the insulation layer 13 and the metal layer 14. The doping layer 15 has a first doping region, a second region, and an active layer disposed between the first doping region and the second region. The gate wiring layer 17 has a plurality of scan lines 171 that may be made of a metal material, such as Molybdenum (Mo) or Tantalum (Ta). The planar layer 19, the first electrode layer 20, the third insulating layer 21, and the second electrode layer 22 are sequentially disposed over the metal layer 14. All of the first electrode layer 20 and the second electrode layer 22 are made of Indium Tin Oxide (ITO) material.

In the array substrate and the display panel of the embodiments of the present disclosure, the aperture ratio of the array substrate may be improved by forming the second touch wiring on the light shielding layer and disposing at least one portion of the second touch wiring below the portion of the data line close to the first region.

In summary, although the present disclosure has been disclosed in the preferred embodiments, the above preferred embodiments are not intended to limit the present disclosure. Those skilled in the art may make various changes and modifications without departing from the spirit and scope of the present disclosure. Therefore, the protection scope of the present disclosure is based on the scope defined by the claims.

What is claimed is:

1. An array substrate, comprising:
a substrate, a light shielding layer disposed on the substrate, an insulation layer disposed on the light shielding layer, and a metal layer disposed on the insulation layer, wherein the array substrate has a first region being transparent and a second region being opaque, and the light shielding layer, the insulation layer, and the metal layer are disposed on the second region;
wherein the metal layer comprises a data line and a first touch wiring;
wherein the light shielding layer comprises a plurality of second touch wirings arranged in an array and coupled with the first touch wiring, at least one portion of the second touch wiring is disposed below a portion of the data line close to the first region;
wherein a width of the first touch wiring is less than or equal to a width of the data line; and
wherein the insulation layer is provided with a plurality of through holes, the through holes comprise a first through hole and a second through hole, and two ends of the first touch wiring couple with two of the second touch wirings arranged in a same column and adjacent to each other through the first through hole and the second through hole.

2. The array substrate as claimed in claim 1, wherein constituent materials of the second touch wiring comprise one or more of molybdenum, aluminum, aluminum-nickel alloy, molybdenum-tungsten alloy, chromium, or copper.

3. The array substrate as claimed in claim 1, wherein one portion of the first touch wiring is close to the first region and rest portion of the first touch wiring are away from the first region, alternatively, the first touch wiring is fully away from the first region.

4. An array substrate, comprising:
a substrate, a light shielding layer disposed on the substrate, an insulation layer disposed on the light shielding layer, and a metal layer disposed on the insulation layer, wherein the array substrate has a first region being transparent and a second region being opaque, and the light shielding layer, the insulation layer, and the metal layer are disposed on the second region;
wherein the metal layer comprises a data line and a first touch wiring
wherein the light shielding layer comprises a plurality of second touch wirings arranged in an array and coupled with the first touch wiring, at least one portion of the second touch wiring is disposed below a portion of the data line close to the first region; and
wherein the insulation layer is provided with a plurality of through holes, the through holes comprise a first through hole and a second through hole, and two ends of the first touch wiring couple with two of the second touch wirings arranged in a same column and adjacent to each other through the first through hole and the second through hole.

5. The array substrate as claimed in claim 4, wherein constituent materials of the second touch wiring comprise one or more of molybdenum, aluminum, aluminum-nickel alloy, molybdenum-tungsten alloy, chromium, or copper.

6. The array substrate as claimed in claim 4, wherein one portion of the first touch wiring is close to the first region and rest portion of the first touch wiring are away from the first region, alternatively, the first touch wiring is fully away from the first region.

7. A display panel comprising an array substrate, the array substrate comprising:
a substrate, a light shielding layer disposed on the substrate, an insulation layer disposed on the light shielding layer, and a metal layer disposed on the insulation layer, wherein the array substrate has a first region being transparent and a second region being opaque, and the light shielding layer, the insulation layer, and the metal layer are disposed on the second region;
wherein the metal layer comprises a data line and a first touch wiring
wherein the light shielding layer comprises a plurality of second touch wirings arranged in an array and coupled with the first touch wiring, at least one portion of the second touch wiring is disposed below a portion of the data line close to the first region; and
wherein the insulation layer is provided with a plurality of through holes, the through holes comprise a first through hole and a second through hole, and two ends of the first touch wiring couple with two of the second touch wirings arranged in a same column and adjacent to each other through the first through hole and the second through hole.

8. The display panel as claimed in claim 7, wherein a width of the first touch wiring is less than or equal to a width of the data line.

9. The display panel as claimed in claim 7, wherein constituent materials of the second touch wiring comprise one or more of molybdenum, aluminum, aluminum-nickel alloy, molybdenum-tungsten alloy, chromium, or copper.

10. The display panel as claimed in claim 7, wherein one portion of the first touch wiring is close to the first region and rest portion of the first touch wiring are away from the first region, alternatively, the first touch wiring is fully away from the first region.

* * * * *